United States Patent [19]

Jeong

[11] Patent Number: 5,693,183

[45] Date of Patent: Dec. 2, 1997

[54] METHOD FOR TREATING THE SURFACE OF SILICON SUBSTRATE POST DRY ETCHING PROCESS

[75] Inventor: Jae Seung Jeong, Seoul, Rep. of Korea

[73] Assignee: LG Semicon Co., Ltd., Seoul, Rep. of Korea

[21] Appl. No.: 731,556

[22] Filed: Oct. 16, 1996

Related U.S. Application Data

[63] Continuation of Ser. No. 447,090, May 22, 1995, abandoned, which is a continuation of Ser. No. 149,643, Nov. 9, 1993, abandoned.

[51] Int. Cl.$^6$ ............................ C23F 1/12; H01L 21/306; H01L 21/322

[52] U.S. Cl. ........................... 156/653.1; 156/662.1; 156/643.1

[58] Field of Search ............................ 156/643.1, 646.1, 156/626.1, 627.1, 653.1, 651.1, 662.1; 437/225; 216/79, 69

[56] References Cited

U.S. PATENT DOCUMENTS

| | | | |
|---|---|---|---|
| 4,330,384 | 5/1982 | Okudaira et al. | 156/643 |
| 4,435,898 | 3/1984 | Gaur et al. | 156/643 |
| 5,047,115 | 9/1991 | Charlet et al. | 156/643 |
| 5,198,072 | 3/1993 | Gabriel | 156/627 |
| 5,290,383 | 3/1994 | Koshimizu | 156/643 |

FOREIGN PATENT DOCUMENTS

| | | |
|---|---|---|
| 0219465 | 4/1987 | European Pat. Off. |
| 4339465 | 5/1995 | Germany. |
| 04023323 | 1/1992 | Japan. |
| 04312921 | 11/1992 | Japan. |

*Primary Examiner*—R. Bruce Breneman
*Assistant Examiner*—George Goudreau
*Attorney, Agent, or Firm*—Morgan, Lewis & Bockius LLP

[57] ABSTRACT

A method for treating the surface of a silicon substrate, which has been subjected to a dry etching process, including applying an electron cyclotron resonance process to the exposed surface to thereby etch away a thin layer of the exposed surface. The ECR etching process is preferably conducted in an $SF_6$—$O_2$ gas mixture and the thickness of the thin layer is no greater than 500 Å. The silicon wafer damaged and contaminated by the dry etching processes can be repaired to the level of virgin, bare silicon wafer by this method. This silicon wafer treatment method allows the semiconductor device thereby fabricated to have improved operating characteristics. For example, the leak current generated in a semiconductor device fabricated on the silicon wafer which has undergone the present treatment is markedly diminished to approximately one-tenth of the leak current generated in the semiconductor device fabricated on the silicon wafer which has not undergone this treatment.

11 Claims, 2 Drawing Sheets

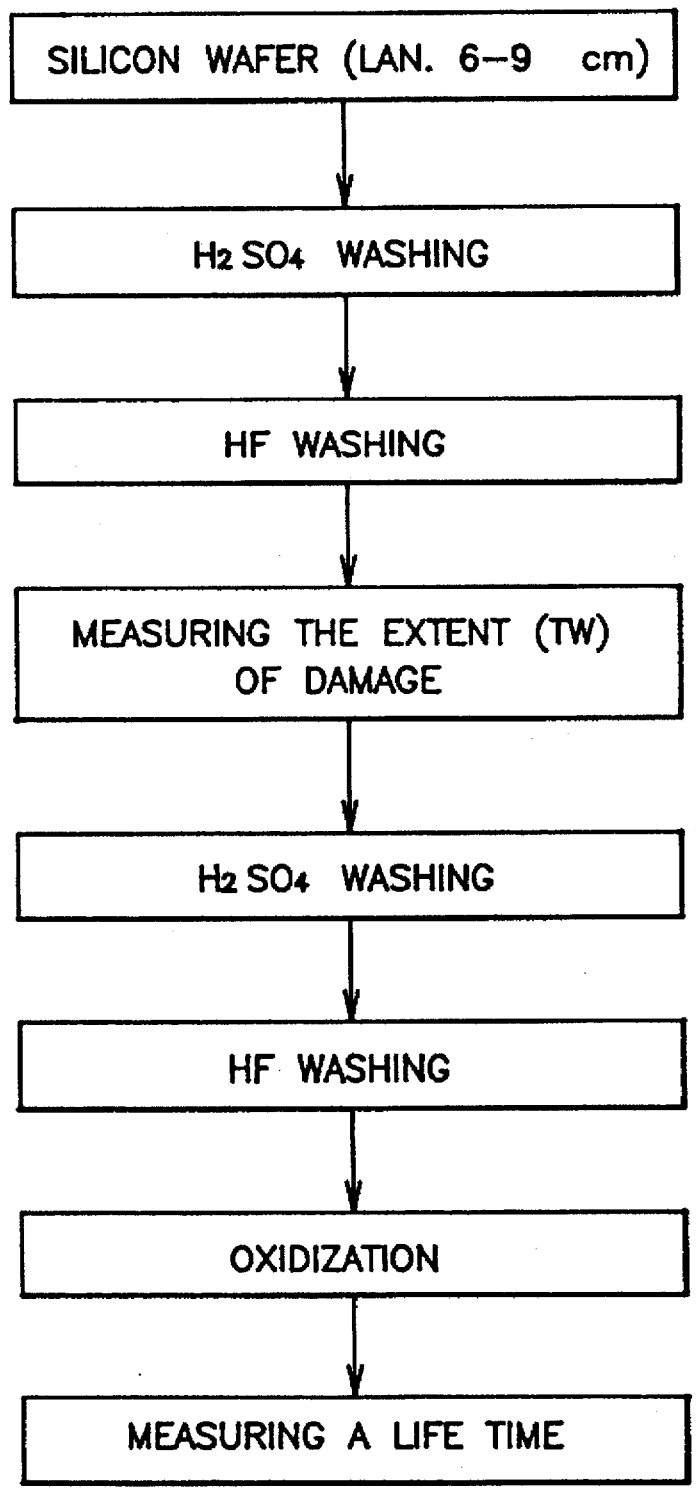

METHOD FOR TREATING THE SURFACE OF SILICON SUBSTRATE POST DRY ETCHING PROCESS

This application is a continuation of application Ser. No.: 08/447,090, filed May 22, 1995, now abandoned; which is a continuation of application Ser. No.: 08/149,643 filed Nov. 9, 1993, now abandoned.

BACKGROUND OF THE INVENTION

The present invention relates in general to a fabricating method for a semiconductor device, and more particularly to a method for treating the surface of silicon substrate which is exposed by dry etching, capable of improving the characteristics of semiconductor device.

In a fabricating method for a semiconductor device, a structure including a silicon substrate is usually subjected to a plasma etch process in order to form a predetermined pattern. While the structure including the silicon substrate is under an over etching after the objective layer to be etched has been removed, the silicon substrate would be exposed to the plasma. This exposure forces the silicon substrate to sustain damage or to be contaminated by foreign particles, so that the surface condition thereof is varied.

Such problems can cause a leak current and the like and adversely affect the characteristics of semiconductor device.

For the purpose of recovering the damaged surface, the surface of silicon substrate which is damaged by plasma during the main etching process is peeled out in such a thin layer as to remove the damaged portion, so that the characteristics of semiconductor device are improved. On etching the damaged surface of silicon substrate in a thin thickness, it is necessary that the surface not sustain further damage. Since over etching may make the depth of the junction formed in the silicon substrate shallow, it is required to set a suitable etching thickness for an optimum effect of the surface etch.

Until now, etching techniques for the surface of silicon substrate have been mainly dependent on a downstream type etching equipment in which an etching chamber is separated therefrom so as not to expose a silicon wafer directly to plasma. Using $O_2$ and $CHF_3$ or $CF_4$ gas, the surface etching is performed by means of the etching equipment.

In the meanwhile, an effort has been made to bring out the same effect in a general dry etching equipment as that in the downstream type equipment employing remote plasma. Anticipating the simplification of process, it was intended to consecutively perform an oxide film etching and a light etching of silicon substrate surface in one chamber. However, this attempt failed to realize the anticipated result. Now, there a system wherein only a chamber is additionally set to one main body of equipment in order to perform the main etching process and the light etching of silicon surface has been used.

Recently, there has been utilized an electron cyclotron resonance system (hereinafter "ECR") as a general etching system, the arrangement of which is schematically illustrated in FIG. 1. This system generates microwaves having a frequency of 2.45 GHz to induce plasma. In the system, a plurality of magnetic coil sets are arranged around a processing chamber to apply a magnetic field to the plasma wherein there is generated such a resonance phenomenon that the rotational motions of particles such as electrons have the same frequency of 2.54 GHz. Thus, while the density of ions in the ECR is much larger than that in any other system, the energy of ions in the ECR is much smaller. Owing to the properties, application of ECR allows the surface of the silicon substrate to be little damaged.

Up to now, the ECR system has been used in only the anisotropic etching process for forming a polysilicon or aluminum wiring. Moreover, a technique wherein an oxide film is etched by using the ECR system has been reported lately. However, the system has not been utilized in etching the surface of silicon substrate damaged by plasma and recovering the damaged surface.

SUMMARY OF THE INVENTION

An object of the invention is to provide a method for treating the surface of the silicon substrate damaged in a dry etching process, wherein the treatment of the surface is accomplished by using an ECR system, which improves the characteristics of semiconductor device.

In accordance with the present invention, this object can be accomplished by providing a method for treating the surface of silicon substrate, comprising the application of an ECR system to a silicon substrate surface exposed by a dry etching process so as to etch the surface in a suitable thickness.

BRIEF DESCRIPTION OF THE DRAWINGS

Other objects and aspects of the invention will become apparent from the following description of embodiments with reference to the accompanying drawings in which:

FIG. 2 is a block diagram showing the process flow of an example according to the present invention and a comparative example.

DETAILED DESCRIPTION OF THE PREFERRED EMBODIMENTS

Figure 1:
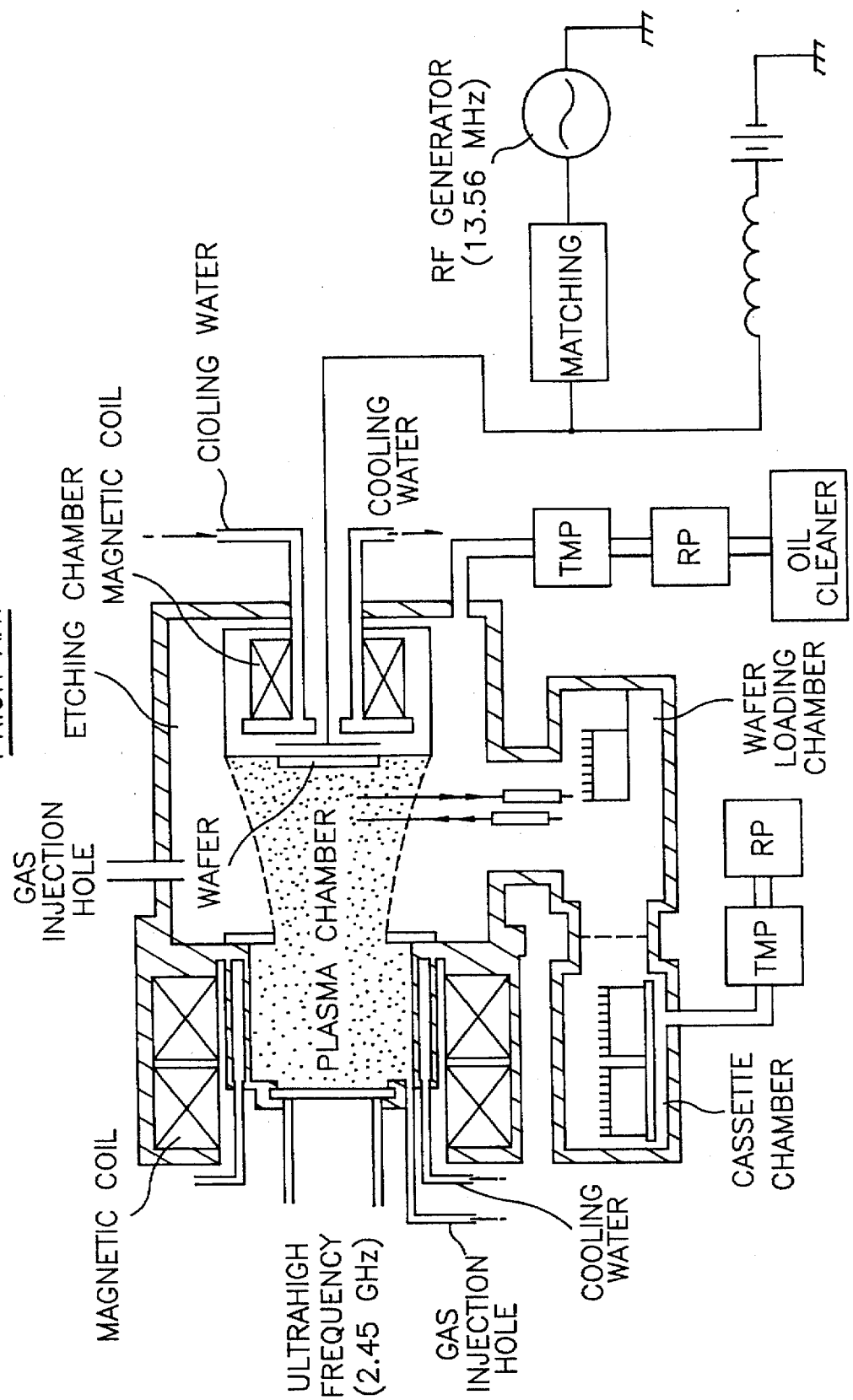
FIG. 1 is a schematic view showing the structure of a prior art ECR system.

Hereinafter, preferred embodiments will be described with reference to the drawings.

While a structure including a silicon substrate is under an over etching after the objective layer which is to be etched has been removed by a plasma etching process, the silicon substrate would be exposed to plasma. This exposure forces the silicon substrate to sustain damage or to be contaminated by foreign particles, so that the surface condition thereof is varied, thereby adversely affecting the characteristics of semiconductor device, such as causing a leak current.

Accordingly, the characteristics of semiconductor device are improved by peeling out the surface of silicon substrate which is damaged by plasma during the main etching process in such a thin layer as to remove the damaged portion. On etching the damaged surface of silicon substrate in a thin layer, it is necessary for the surface not to sustain further damage. Since over etch may make the depth of the junction formed in the silicon substrate shallow, it is required to set a suitable etching thickness for bringing out an optimum effect of the surface etch.

In accordance with the present invention, the damaged surface is recovered by utilizing an ECR system in removing the surface damaged by plasma during main etching processes.

The ECR system generates microwave having a frequency of 2.45 GHz to induce plasma. In the system, a plurality of magnetic coil sets are arranged around a processing chamber in order to apply a magnetic field to the plasma wherein there occurs such a resonance phenomenon that the rotational motions of particles such as electrons have a frequency of 2.54 GHz which is the same frequency that the ECR generates. Thus, while the density of ions in the ECR is much larger than that in any other system, the energy of ions in the ECR is much smaller. Owing to these properties, application of ECR allows the surface of silicon substrate to be little damaged.

In accordance with the present invention, a thin layer of the damaged surface is etched away by the ECR employing a proper mixture of $SF_6$ and $O_2$.

Referring to FIG. 2, the preferred example of the present invention will now be further described along with its comparative example. It should be understood that these examples are intended to be illustrative only and the present invention is not limited to the conditions, materials or devices recited therein.

EXAMPLE 1

Two bare silicon wafers were treated with an oxide film etching equipment to etch the respective surface thereof in a thickness of 300 Å, on the basis of a thermal oxide film. Subsequently, using an ECR, the resulting surfaces were further subjected to an etch to prepare two specimens A and B, whose surfaces were removed in the thicknesses of 100 and 200 Å, respectively.

Separately, three bare silicon wafers were treated with an oxide film etching equipment to etch the respective surfaces thereof in a thickness of 1,000 Å, on the basis of the thermal oxide film. Subsequently, using the ECR, the resulting surfaces were further subjected to an etch to prepare three specimens C, D and E, of which the surfaces were removed in the thicknesses of 100, 200 and 300 Å respectively.

According to the order of the process flow shown in FIG. 2, the silicon wafers, of which each surface was treated in accordance with the present invention, were initially washed with $H_2SO_4$ solution, and then washed with HF solution. Measurement for the extent of damage was carried out for the respective silicon wafer. Again, the silicon wafers were washed with $H_2SO_4$ and HF solutions, successively, followed by the oxidation of the surfaces of the silicon wafers. Life times of the respective silicon wafer were measured.

On etching the surface of silicon substrate by means of ECR, the process condition was as follows: equipment; ECR system shown in FIG. 1, gas; $SF_8$ 5–50 sccm and $O_2$ 10–200 sccm, preferably $SF_8$ 25 sccm and $O_2$ 50 sccm, RF power; 0–20 W, preferably 5 W, pressure; 2–50 mTorrs, preferably 10 mTorrs.

COMPARATIVE EXAMPLE 1

One bare silicon wafer F which was a reference and two specimens G and H which were prepared by treating two bare silicon wafers with an oxide film etching equipment to etch the surfaces in a thickness of 300 and 1,000 Å, respectively, on the basis of a thermal oxide film were initially washed with $H_2SO_4$ and then washed with HF solution, according to the order of the process flow shown in FIG. 2. Measurement for the extent of damage was carried out for the respective silicon wafer. Again, the silicon wafers were washed with $H_2SO_4$ and HF solutions, successively, followed by the oxidation of the surfaces of the silicon wafers. Life times of the respective silicon wafer were measured.

The surface conditions for the resulting silicon wafers A, B, C, D and E of Example 1, and of the resulting silicon wafer F, G, and H of Comparative Example 1 were measured and compared with one another, and the results are given as set forth in the following Table.

TABLE

| Silicon Wafer | Processing | Damage (TW unit) | Life Time (μm) |
|---|---|---|---|
| A | 300 Å oxide film etching + 100 Å silicon etching | 28.4 | 170.0 |
| B | 300 Å oxide film etching + 200 Å silicon etching | 27.0 | 170.0 |
| C | 1,000 Å oxide film etching + 100 Å silicon etching | 28.7 | 126.3 |
| D | 1,000 Å oxide film etching + 200 Å silicon etching | 27.4 | 175.0 |
| E | 1,000 Å oxide film etching + 300 Å silicon etching | 27.1 | 166.3 |
| F | reference silicon wafer | 26.0 | 187.5 |
| G | 300 Å oxide fiim etching | 726.1 | 87.5 |
| H | 1,000 Å oxide fiim etching | 735.4 | 32.5 |

In the above Table, as the value of thermal wave (TW), which represents the damage extent of the surface, increases, the silicon wafer sustains more serious damages. On the other hand, as the value of the life time, which represents the contamination extent caused by outer particles decreases, the silicon wafer are more adversely affected.

As recognized in the Table, the silicon wafers A, B, C, D and E which was treated in accordance with the present invention have the nearly same TW and life time value as the reference the bare silicon wafer.

From the Table, it is found that the silicon wafer damaged and contaminated by dry etching is recovered by the treatment of ECR according to the present invention into the level of the bare silicon wafer in which there are neither damage nor contamination.

On the other hand, the TW values of the silicon wafer G and H of the Comparative Example, which were not subjected to the treatment of ECR etching, are much larger than those of the reference silicon wafer whereas the life time values thereof are much smaller.

From the results of Example and Comparative Example, it is recognized that the recovery effect for the damaged silicon surface is excellent in accordance with the present invention.

As described above, the silicon wafer damaged and contaminated by some etching processes is capable of being recovered to such a level of virgin, bare silicon wafer, which has not undergone any process by applying the ECR etching to the damaged and contaminated silicon wafer.

Therefore, the treatment of silicon wafer according to the present invention allows the semiconductor device fabricated to be improved in operating characteristics. For example, the leak current generated in the semiconductor device fabricated on the silicon wafer which has undergone the treatment according to the present invention is remarkably diminished to, for example, 0.1 times of the leak current generated in the semiconductor device fabricated on the silicon wafer which has not undergone the treatment.

What is claimed is:

1. A method for treating an exposed surface of a silicon substrate that has undergone a dry etching process, said method comprising:

applying an electron cyclotron resonance process to the exposed surface using an RF power of 20 watts or less in an $SF_6+O_2$ gas mixture at a pressure of 2 to 50 mTorr wherein $SF_6$ is between 5 and 50 sccm and $O_2$ is between 10 and 200 sccm, and wherein the $O_2$ flowrate is greater than the $SF_6$ flowrate, to thereby etch away a layer of the exposed surface.

2. A method according to claim 1 wherein the thickness of the layer is no more than 500 Å.

3. A method for treating an exposed surface of a silicon substrate that has undergone a dry etching process, said method comprising:

applying an electron cyclotron resonance process using an RF power of 20 watts or less in an $SF_6+O_2$ gas mixture comprising $SF_6$ between 5 and 50 sccm and $O_2$ between 15 and 200 sccm to the exposed surface, and wherein the $O_2$ flowrate is greater than the $SF_6$ flowrate, to thereby etch away a layer of the exposed surface.

4. A method according to claim 3 wherein the thickness of the layer is no more than 500 Å.

5. A method according to claim 3 wherein said electron cyclotron resonance etching process is performed at a pressure of 2 to 50 mTorr.

6. A method for treating an exposed surface of a silicon substrate that has undergone a dry etching process, said method comprising:

applying an electron cyclotron resonance process in a gas mixture consisting of $SF_6+O_2$ at 2 to 50 mTorr wherein $SF_6$ is between 5 and 50 sccm and $O_2$ is between 15 and 200 sccm to the exposed surface, and wherein the $O_2$ flowrate is greater than the $SF_6$ flowrate, to thereby etch away a layer of the exposed surface.

7. A method for treating an exposed surface of a silicon substrate that has undergone a dry etching process, said method comprising:

applying an electron cyclotron resonance process to the exposed surface using an RF power of 20 watts or less in a gas mixture consisting essentially of $SF_6+O_2$ wherein $SF_6$ is between 5 and 50 sccm and $O_2$ is between 10 and 200 sccm, and wherein the $O_2$ flowrate is greater than the $SF_6$ flowrate, to thereby etch away a layer of the exposed surface.

8. A method according to claim 7 wherein the thickness of the layer is no more than 500 Å.

9. A method according to claim 7 wherein said applying process includes the electron cyclotron resonance process using an RF power of five watts.

10. A method according to claim 7 wherein said electron cyclotron resonance etching process is performed at a pressure of 2 to 50 mTorr.

11. A method for treating an exposed surface of a silicon substrate that has undergone a dry etching process, said method comprising:

applying an electron cyclotron resonance process to the exposed surface using an RF power of 20 watts or less in a gas mixture consisting of $SF_6$ and $O_2$ at substantially 10 mTorr wherein $SF_6$ is provided at 25 sccm and $O_2$ is provided at 50 sccm, thereby etching away a layer of the exposed surface.

* * * * *